United States Patent
Tomari et al.

(10) Patent No.: US 7,639,338 B2
(45) Date of Patent: Dec. 29, 2009

(54) LCD DEVICE HAVING EXTERNAL TERMINALS

(75) Inventors: Shinichi Tomari, Kanagawa (JP); Futoshi Nakanishi, Kanagawa (JP)

(73) Assignee: NEC LCD Technologies, Ltd. (JP)

( * ) Notice: Subject to any disclaimer, the term of this patent is extended or adjusted under 35 U.S.C. 154(b) by 429 days.

(21) Appl. No.: 11/124,803

(22) Filed: May 9, 2005

(65) Prior Publication Data
US 2005/0253992 A1    Nov. 17, 2005

(30) Foreign Application Priority Data
May 11, 2004   (JP)  .............................. 2004-141168

(51) Int. Cl.
*G02F 1/1345* (2006.01)
(52) U.S. Cl. ...................... 349/149; 349/152
(58) Field of Classification Search ................. 349/149, 349/152
See application file for complete search history.

(56) References Cited

U.S. PATENT DOCUMENTS

| | | | |
|---|---|---|---|
| 5,923,389 A * | 7/1999 | Seki ............................. | 349/32 |
| 6,285,433 B1 * | 9/2001 | Kawasaki .................... | 349/149 |
| 2004/0119929 A1 * | 6/2004 | Tanaka et al. ................ | 349/152 |
| 2004/0165120 A1 * | 8/2004 | Woo et al. ..................... | 349/42 |
| 2004/0201809 A1 * | 10/2004 | Ohta et al. ................... | 349/139 |
| 2005/0179851 A1 * | 8/2005 | Hayashi et al. ............. | 349/152 |

FOREIGN PATENT DOCUMENTS

| | | |
|---|---|---|
| JP | 06-180460 | 6/1994 |
| JP | 11-281991 | 10/1999 |

* cited by examiner

*Primary Examiner*—David Nelms
*Assistant Examiner*—Nathanael R Briggs
(74) *Attorney, Agent, or Firm*—Hayes Soloway P.C.

(57) ABSTRACT

A LCD device includes external terminals for metallic interconnects in a peripheral area on which TCPs are mounted. The external terminal includes a first ITO film connected to the metallic interconnect, a second ITO film formed on the first ITO film and a plurality of insulator islands sandwiched between the first ITO film and the second ITO film. The surface of the second ITO film has convex and concave portions whereby electric connection between the terminal of the TCP and the second ITO film is improved.

10 Claims, 3 Drawing Sheets

LCD DEVICE HAVING EXTERNAL TERMINALS

BACKGROUND OF THE INVENTION (a) Field of the Invention

The present invention relates to a LCD device having external terminals and, more particularly, to the structure of external terminals in a LCD device.

(b) Description of the Related Art

LCD (liquid crystal display) devices have advantages of smaller thickness and lower power dissipation, and are thus used in a variety of appliances. FIG. 5 shows a peripheral portion of a conventional LCD device 200 together with a TCP (tape carrier package) among a plurality of TCPs 204 mounted on the LCD device 200 for diving the same. The LCD device 200 includes a pair of glass substrates 201 and 208 sandwiching therebetween a liquid crystal layer 202. Glass substrate 201 is referred to as an array substrate on which an array of switching devices, a plurality of data lines, a plurality of scanning lines etc. are formed. Glass substrate 203 is referred to as a counter substrate on which color filters are mounted.

In the LCD device 200, the array substrate 201 has a central area, or display area 211, in which the array substrate 201 opposes the counter substrate 203, and a peripheral area 212 in which the array substrate 201 mounts thereon the TCPs 204. The data lines, scanning lines and power source lines formed in the display area 211 extend from the display area 211 to the peripheral area 212 as metallic interconnects 206. Each of the external terminals 205 for the metallic interconnects 206 includes an ITO (indium-tin-oxide) cap layer, or transparent conductive layer 208 connected to the metallic interconnects 206 through a through-hole formed in an insulation film 207 overlying the metallic interconnects 206.

The TCP 204 is configured as an IC driver for driving a group of data lines or scanning lines on the LCD device 200. The TCP 204 has thereon a solder resist film, formed in an area of the TCP 204 other than the area which is in direct contact with the peripheral area 212 of the array substrate 201. More specifically, the solder resist film is not formed in the space between adjacent terminals of the TCP 204 connected to the external terminals 206 on the array substrate 201. The TCP 204 is adhered onto the array substrate 201 by means of an anisotropic conductive film (ACF) 209 wherein conductive particles 210 are dispersed in insulator resin. The conductive particles 210 electrically connect the external terminals 205 on the array substrate 210 to the terminals 205 of the TCP 204. The structure such as shown in FIG. 5 is described in Patent Publication JP-A-11(1999)-281991, for example.

Another structure for electrically connecting the terminals of the driver circuit to the external terminals on the array substrate is described in Patent Publication JP-A-6(1994)-180460. The another structure is generally referred to as chip-on-glass (COP) structure wherein a driver IC is directly mounted on the glass substrate on which bumps are formed in advance. In the described technique, the bumps are configured by terminal portions of the metallic interconnects, which are formed on the array substrate via an insulator island.

It is noted that the LCD device 200 shown in FIG. 5 has a problem in that ingress of water cannot be completely suppressed by the ACF 209 and the ITO cap layer 208, whereby the contact between the ITO cap layer 208 and the metallic interconnect 6 suffers from corrosion. This problem is common to the another structure or COP structure as described above.

It is also noted that the pitch of the terminals of the TCP has been reduced remarkably and the thickness of the copper foil configuring the terminals has been reduced accordingly, whereby the mechanical strength of the coupling between the TCP and the array substrate has been reduced. In addition, in the electrical connection using the ACF, there is a limit in the number of conductive particles because a larger number of conductive particles increases the possibility of a short-circuit failure in the situation of reduced pitch, due to contacts of the conductive particles occurring between adjacent terminals in a row.

SUMMARY OF THE INVENTION

In view of the above problems in the conventional technique, it is an object of the present invention to provide a LCD device having superior electric connections between the LCD device and the TCP as well as a reduced pitch for the terminals of the TCP.

The present invention provides, in a first aspect thereof, a liquid crystal display (LCD) device including first and second substrates sandwiching therebetween a liquid crystal layer, the first substrate mounting thereon a plurality of interconnects and associated external terminals for connecting to an external circuit, at least one of the external terminals including a first conductive film connected to a corresponding one of the interconnects via at least one through-hole, a second conductive film formed on the first conductive film, and at least one insulator island sandwiched between the first conductive film and the second conductive film.

The present invention also provides, in a second aspect thereof, a liquid crystal display (LCD) device comprising first and second substrates sandwiching therebetween a liquid crystal layer, said first substrate mounting thereon a plurality of interconnects and associated external terminals for connecting to an external circuit, at least one of said external terminals including at least one insulator island formed on a corresponding one of said interconnects, and a conductive film formed on said corresponding one of said interconnects and said insulator island.

In accordance with the present invention, the insulator island affords a convex portion for the surface of the external terminal, wherein a reliable electric connection can be obtained between the external terminal and a terminal of the external circuit due to the convex portion of the external terminal.

The above and other objects, features and advantages of the present invention will be more apparent from the following description, referring to the accompanying drawings.

PREFERRED EMBODIMENT OF THE INVENTION

Figure 1A:
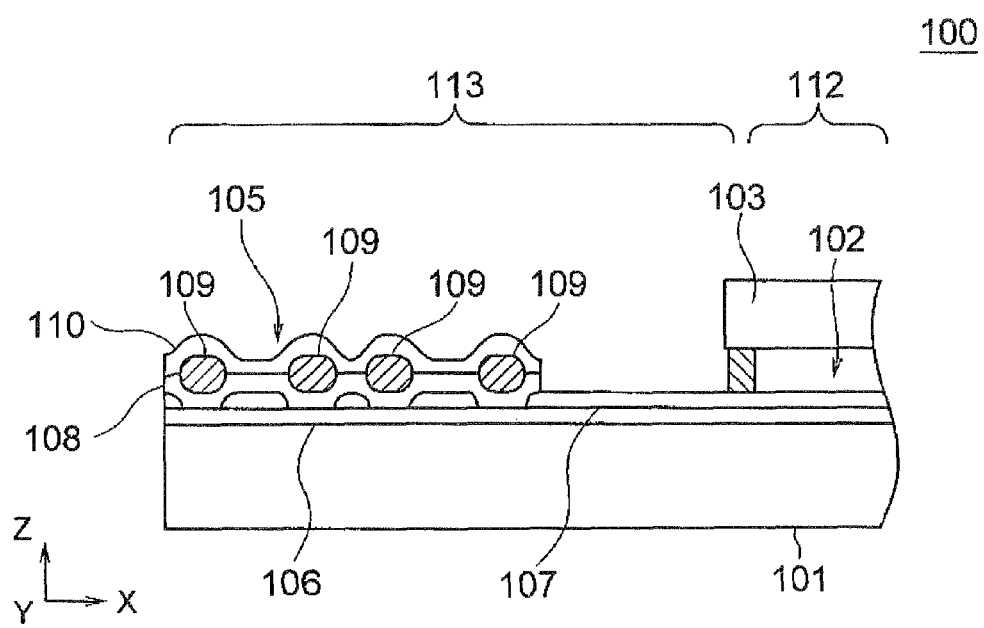
FIG. 1A is a partial sectional view of a LCD device according to a first embodiment of the present invention.

Now, the present invention is more specifically described with reference to accompanying drawings, wherein similar constituent elements are designated by similar or related reference numerals.

Figure 1B:
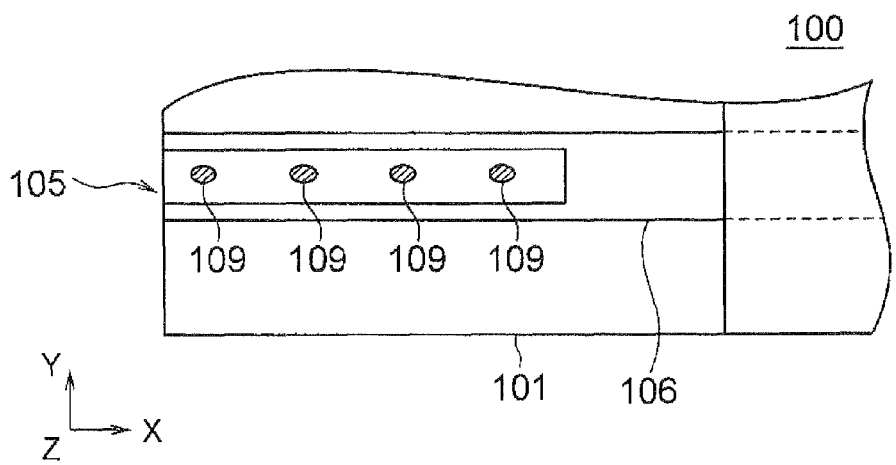
FIG. 1B is a partial top plan view of the LCD device shown in FIG. 1A.

Referring to FIGS. 1A and 1B, a LCD device, generally designated by numeral 100, according to a first embodiment of the present invention includes an array substrate 101 and a counter substrate 103 sandwiching therebetween a liquid crystal layer 102. The LCD device 100 is connected to a plurality of TCPs which are not depicted in FIG. 1A. The array substrate 101 has a display area 112 in which the array substrate 101 opposes the counter substrate 103, and a peripheral area 113 in which the array substrate 101 has thereon external terminals 105. The counter substrate 103 mounts thereon color filters not shown.

In the display area 112 of the array substrate 101, there are formed switching transistors, data lines, scanning lines and power source lines including ground lines for driving an array of pixels in the LCD device 100. The data lines, scanning lines and power source lines extend from the display area 112 to the peripheral area 113 as metallic interconnects 106. The metallic interconnects 106 are made of Al, Mo, Ta or an alloy of two or more of these metals.

External terminals 105 are formed on the respective metallic interconnects in the peripheral area 113 of the array substrate 101. Each external terminal 105 includes a first conductive film 108 in contact with the metallic interconnect 106 via through-holes formed in an insulating film 107, a second conductive film 110 formed on the first conductive film 108, and a plurality of insulator islands 109 sandwiched between the first conductive film 108 and the second conductive film 110. The first and second conductive films 108 and 110 are made of a metallic material such as ITO. The insulator island 109 is made of inorganic or organic insulator. The insulator island 109 provides convex and concave portions of the top surface of the external terminal 105 depending on the presence or absence of the insulator island 109.

The external terminals 105 are formed in the process as described hereinafter. First, the insulating film 107 covering the metallic interconnects 106 is etched by a photolithographic and patterning step, thereby forming through-holes to expose therefrom portions of the metallic interconnects 106. Thereafter, the first conductive films 108 are formed to overlie and align with terminal portions of the metallic interconnects 106, whereby the first conductive films 108 are electrically connected to the respective metallic interconnects 106 via the through-holes. Subsequently, insulator islands 109 are formed on each first conductive film 108 to overlie and align with the through-holes, followed by forming a second conductive film 110 on each first conductive film 108 and the insulator islands 109.

Figure 2:
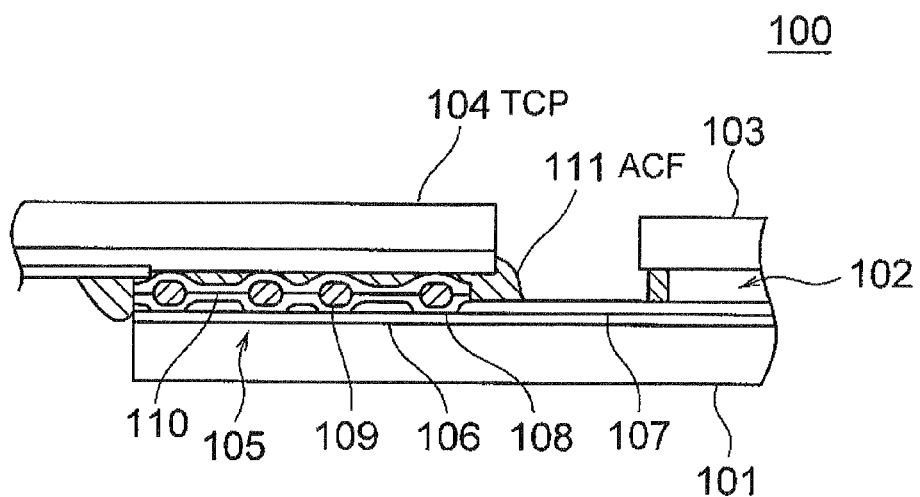
FIG. 2 is a partial sectional view of the LCD device shown in FIG. 1A in the state of mounting TCPs thereon.
Figure 5:
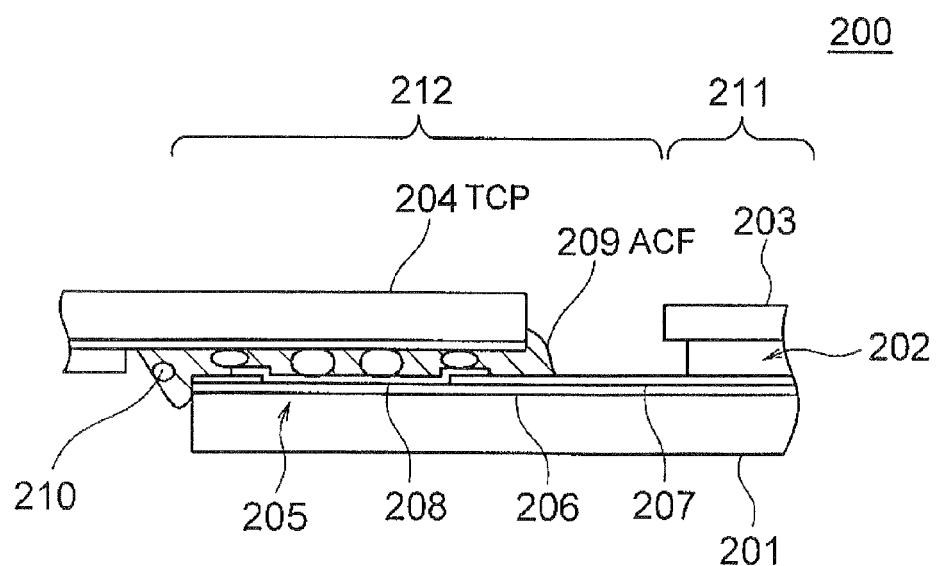
FIG. 5 is a partial sectional view of a conventional LCD device.

FIG. 2 shows the LCD device 100 shown in FIG. 1, after the step of mounting the TCPs 104 on the LCD device 100. The external terminals 105 on the array substrate 101 and respective terminals of the TCP 104 are connected together via the conductive particles, such as 210 in FIG. 5, in the ACF 111, which includes the conductive particles dispersed in thermosetting resin mechanically coupling together the TCP 104 and the array substrate 101. The convex portions of the second conductive film 110 formed by the insulator islands 109 improve the electric contact between the external terminal 105 on the array substrate 101 and a corresponding terminal of the TCP 104.

For the external terminal 105 on the array substrate 105 in the present embodiment, the through-holes through which portions of the metallic interconnect 106 are roughly plugged or capped by the insulator islands 109 overlying the through-holes. This prevents the ingress of water to the contact between the metallic interconnect 106 and the first conductive film 108. Thus, the metallic interconnects 106 as well as the first conductive films 108 may be made of conductive materials other than materials having a high resistance to corrosion. It is preferable to select a moderate degree of hardness for the insulator islands 109 so that the insulator islands 109 prevent excessive deformation of the conductive particles in the ACFs 111 to achieve a reliable electric contacts between the terminals via the conductive particles.

In the present embodiment, since the convex portions of the external terminals 105 formed by the insulator islands 109 achieve a superior electric contact, the number of particles per unit volume of the ACF 111 may be reduced. In another case, a non-conductive film (NCF) may be used in place of the ACF 111, wherein the electric contact is achieved by the convex portions of the second conductive film 110 being in direct contact with the terminals of the TCP 104. The use of a reduced number of conductive particles in the ACF 111 or use of the NCF in place of the ACF 111 affords an improvement to the electric isolation between adjacent external terminals 105 on the array substrate 101, thereby allowing reduction of the pitch of the terminals 105 substantially without involving a short-circuit failure.

In addition, the use of reduced number of conductive particles or the use of NCF allows the solder resist film to be disposed between adjacent terminals of the TCP 104 substantially without involving a short-circuit failure, which may be caused by the contact of the conductive particles in a row between adjacent terminals. The solder resist generally has a suitable adhesive property with respect to the ACF or NCF. Thus, the arrangement of the solder resist between adjacent terminals improves adhesion strength between the array substrate 101 and the TCP 104, to thereby increase the mechanical strength of the coupling.

Figure 3:
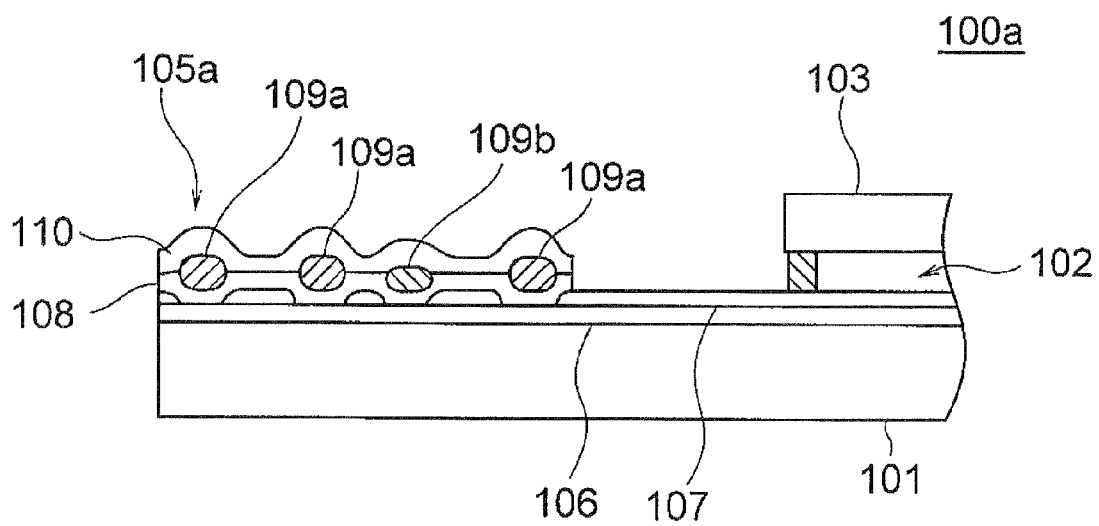
FIG. 3 is a partial sectional view of a LCD device according to a second embodiment of the present invention.

FIG. 3 shows a LCD device 100a, according to a second embodiment of the present invention. In the present embodiment, the insulator islands 109 formed in the external terminal 105 include first insulator islands 109a, having a mechanically-soft property and second insulator islands 109b, having a mechanically-hard property. The first insulator islands 109a, may be made of an organic insulator, for example, whereas the second islands 109b, may be made of an inorganic insulator, for example.

The first insulator islands 109a, have a larger height compared to the second insulator islands 109b. After mounting the TCP 104 onto the array substrate 101 via the external terminals 105, the first insulator islands 109a, have larger deformations compared to the second insulator islands 109b. This affords a further superior electric connection between the external terminals 105 on the array substrate 101 and the terminals of the TCP 104.

Figure 4:
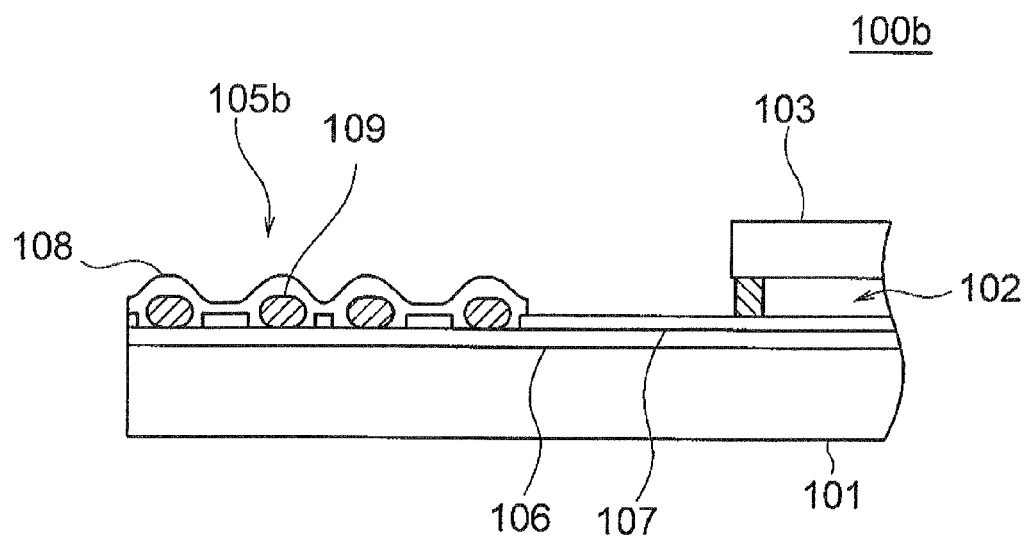
FIG. 4 is a partial sectional view of a LCD device according to a modification from the first embodiment.

In the above embodiments, each external terminal 105 on the array substrate 101 has a two-layer structure wherein the two conductive layers 108 and 110 sandwich therebetween insulator islands 109. However, the present invention is not limited to this structure of the external terminals. FIG. 4 shows another LCD device 100b, modified from the first embodiment. In FIG. 4, the external terminal 105 has a single-layer structure, wherein the insulator islands 109 are disposed within through-holes formed in the insulator film 107 overlying the metallic interconnects 106. A conductive film 108 overlies the insulator islands 109 and the insulator film 107, and thus has convex portions and concave portions on the top surface thereof. It is to be noted that the insulator islands 109 may include organic islands and inorganic islands, similarly to the second embodiment.

In the examples of the above embodiments and modification, TCPs 104 are mounted on the external terminals on the array substrate 101. However, the present invention is not limited to such a configuration. For example, a FPC (flexible printed circuit) or an IC chip for driving the LCD device may be mounted on external terminals 105 formed on the array substrate 101. Further, the external terminals 105 may be formed on the counter substrate 103 instead.

Since the above embodiments are described only for examples, the present invention is not limited to the above embodiments and various modifications or alterations can be easily made therefrom by those skilled in the art without departing from the scope of the present invention.

What is claimed is:

1. A liquid crystal display (LCD) device comprising first and second substrates sandwiching therebetween a liquid crystal layer, said first substrate mounting thereon a plurality of interconnects and associated external terminals for connecting to an external circuit,
   at least one of said external terminals including a first conductive film connected to a corresponding one of said interconnects via at least one through-hole, a second conductive film formed on said first conductive film, and at least one insulator island sandwiched between said first conductive film and said second conductive film and providing convex and concave portions in the second conductive film, wherein said insulator island overlies said through-hole.

2. The LCD device according to claim 1, wherein said at least one through-hole include a plurality of through-holes, and said at least one insulator island include a plurality of insulator islands which overlie respective said through-holes.

3. The LCD device according to claim 2, wherein said insulator islands include at least one organic island and at least one inorganic island.

4. The LCD device according to claim 3, wherein said organic island has a larger height compared to said at least one inorganic island.

5. The LCD device according to claim 1, wherein said external circuit has own terminals connected to said external terminals, and includes a solder resist film between adjacent two of said own terminals.

6. The LCD device according to claim 1, wherein said first and second conductive films comprise indium-tin-oxide.

7. The LCD device according to claim 1, wherein said plurality of interconnects comprise Al, Mo, Ta or an alloy including at least two of Al, Mo and Ta.

8. The LCD device according to claim 1, wherein said external circuit and said first substrate are coupled together via an anisotropic conductive film.

9. The LCD device according to claim 1, wherein said external circuit and said first substrate are coupled together via thermo-setting resin.

10. A liquid crystal display (LCD) device comprising first and second substrates sandwiching therebetween a liquid crystal layer, said first substrate mounting thereon a plurality of interconnects and associated external terminals for connecting to an external circuit,
    at least one of said external terminals including at least one insulator island formed on a corresponding one of said interconnects, and a conductive film having convex and concave portions formed on said corresponding one of said interconnects and said insulator island, wherein said insulator island is disposed within a through-hole formed in said external terminal.

* * * * *

UNITED STATES PATENT AND TRADEMARK OFFICE
CERTIFICATE OF CORRECTION

PATENT NO. : 7,639,338 B2  Page 1 of 1
APPLICATION NO. : 11/124803
DATED : December 29, 2009
INVENTOR(S) : Tomari et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 497 days.

Signed and Sealed this

Ninth Day of November, 2010

David J. Kappos
*Director of the United States Patent and Trademark Office*